United States Patent
Wang (10) Patent No.: US 7,133,561 B2
(45) Date of Patent: *Nov. 7, 2006

(54) PALETTIZED IMAGE COMPRESSION

(75) Inventor: Albert Szu-chi Wang, Palo Alto, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/893,665

(22) Filed: Jul. 16, 2004

(65) Prior Publication Data

US 2004/0252898 A1   Dec. 16, 2004

Related U.S. Application Data

(63) Continuation of application No. 09/577,544, filed on May 24, 2000, now Pat. No. 6,856,700.

(51) Int. Cl.
*G06K 9/36* (2006.01)
*G06K 9/46* (2006.01)

(52) U.S. Cl. .................. 382/232; 382/239; 382/246

(58) Field of Classification Search ........ 382/239–240, 382/244–247, 232; 241/51, 65, 106; 341/51, 341/65, 108

See application file for complete search history.

(56) References Cited

U.S. PATENT DOCUMENTS 5,680,129 A   10/1997  Weinberger et al.
5,784,175 A   7/1998   Lee
6,856,700 B1  2/2005   Wang

OTHER PUBLICATIONS

Paul Ausbeck, "Content Models for Palette Images," Data Compression Conference, DCC 1998, Mar. 30-Apr. 1, 1998, Snowbird, Utah, USA IEEE Computer Society, 1998.
"Introduction to Data Compression," Khalid Sayood, Morgan Stanley Publishers, Inc., San Francisco, CA, pp. 87-94, 338-348, 1998.

*Primary Examiner*—Duy M. Dang
(74) *Attorney, Agent, or Firm*—Lee & Hayes, PLLC (57) ABSTRACT

An adaptive entropy coder is coupled with a localized conditioning context to provide efficient compression of images with localized high frequency variations. In one implementation, an arithmetic coder can be used as the adaptive entropy coder. The localized conditioning context includes a basic context region with multiple context pixels that are adjacent the current pixel, each of the context pixels having an image tone. A state is determined for the basic context region based upon a pattern of unique image tones among the context pixels therein. An extended context region that includes the basic context region is used to identify a non-local trend within the context pixels and a corresponding state. A current pixel may be arithmetically encoded according to a previously encoded pixel having the same tone or as a not-in-context element. In one implementation, a not-in-context element may be represented by a tone in a color cache that is arranged as an ordered list of most recent not-in-context values.

12 Claims, 8 Drawing Sheets

NO TREND
(TREND 0)

HORIZONTAL TREND ONLY
(TREND 1)

VERTICAL TREND ONLY
(TREND 2)

HORIZONTAL & VERTICAL TREND
(TREND 1)

Fig. 11 cache hit
rotate value to top of cache

Fig. 12 cache miss
push value onto top of cache
discard bottom value

Fig. 10

PALETTIZED IMAGE COMPRESSION

RELATED APPLICATIONS

This application is a continuation of and claims priority to U.S. patent application Ser. No. 09/577,544, filed May 24, 2000, now U.S. Pat. No. 6,856,700, the disclosure of which is incorporated by reference herein.

FIELD OF THE INVENTION

The present invention relates to data compression and, in particular, to compression of digital image data.

BACKGROUND AND SUMMARY OF THE INVENTION

A wide range of methods and algorithms are available for compression of digital images and, particularly, the image data corresponding to the pixels in a digital image. The different available methods and algorithms are typically suited to particular types of digital images. An example of such particularized suitability is the JPEG compression standard, which is a widely-adopted standard compression algorithm that is based upon the discrete cosine transform (DCT). JPEG compression and the DCT are described in, for example, *Introduction to Data Compression* by Khalid Sayood, Morgan Kaufmann Publishers, Inc., San Francisco, Calif., 336–348, 1996.

JPEG compression applies the DCT to image data corresponding to successive 8×8 blocks of pixels. The DCT is effective and efficient with regard to linear correlations that arise over each 8×8 block of pixels. Digital images with these characteristics might include images that correspond to photographs or images with relatively large regions of similar color or tone. Images corresponding to photographs typically include a substantially continuous range of image tones represented by binary values of 24-bits or more. In many such continuous-tone digital images, the variations within the range of image tones are typically well accommodated by the DCT in JPEG compression. Images with relatively large regions of the same color or tone have no changes in tone over those regions and may be effectively compressed by JPEG compression, as well as other compression methods.

It will be appreciated, however, that continuous-tone images are not the only types of digital images. In some applications, digital images may include a smaller range of discrete image colors or tones (e.g., represented by 8-bits, or fewer) or localized high frequency variations such as text elements or other image discontinuities. These types of discrete-tone images, sometimes called palettized images, arise in a variety of applications including, for example, training or help-screen images for software that uses widowed or other graphical user interfaces, shared whiteboards or application sharing, online training, simple animations, etc. The images that arise in such applications are often inefficiently encoded by JPEG compression due to the spatially localized high frequency and discontinuous features in the images.

The present invention includes an adaptive entropy coder coupled with a localized conditioning context to provide efficient compression of discrete-tone images with localized high frequency variations. In one implementation, an arithmetic coder can be used as the adaptive entropy coder.

The localized conditioning context includes a basic context region with multiple context pixels that are adjacent the current pixel, each of the context pixels having an image tone. A state is determined for the basic context region based upon the pattern of unique image tones among the context pixels therein. An extended context region that includes the basic context region is used to identify a non-local trend within the context pixels and a corresponding state. The current pixel is then encoded as having one of the tones in the context or as a not-in-context element. In one implementation, a not-in-context element may be represented by a tone in a color cache that is arranged as an ordered list of most recent not-in-context values.

Statistics for conditional probabilities are gathered for each context during encoding. Many traditional context-based coders choose contexts that are based on the values present in the surrounding context. Since the number of states in the coder grows exponentially with the size of the context, traditional context-based coders work well only when the possible set of values is small (e.g. black and white or binary images), or when the context is very small (one element).

The present invention allows the use of a large context (e.g., up to at least six elements) with elements that can take on many values. This is performed by quantizing the huge number of fundamental states (about 300 trillion) into a set of meaningful patterns (e.g., 60) that are based on the number of unique image tones or values. These patterns model palettized images well. Quantizing the states into this set of meaningful patterns, rather than scalar quantizing the values of the elements, as is traditionally done, greatly increases the efficiency with which palettized images can be encoded or compressed.

Additional objects and advantages of the present invention will be apparent from the detailed description of the preferred embodiment thereof, which proceeds with reference to the accompanying drawings.

DETAILED DESCRIPTION OF THE PREFERRED EMBODIMENTS

Figure 1:
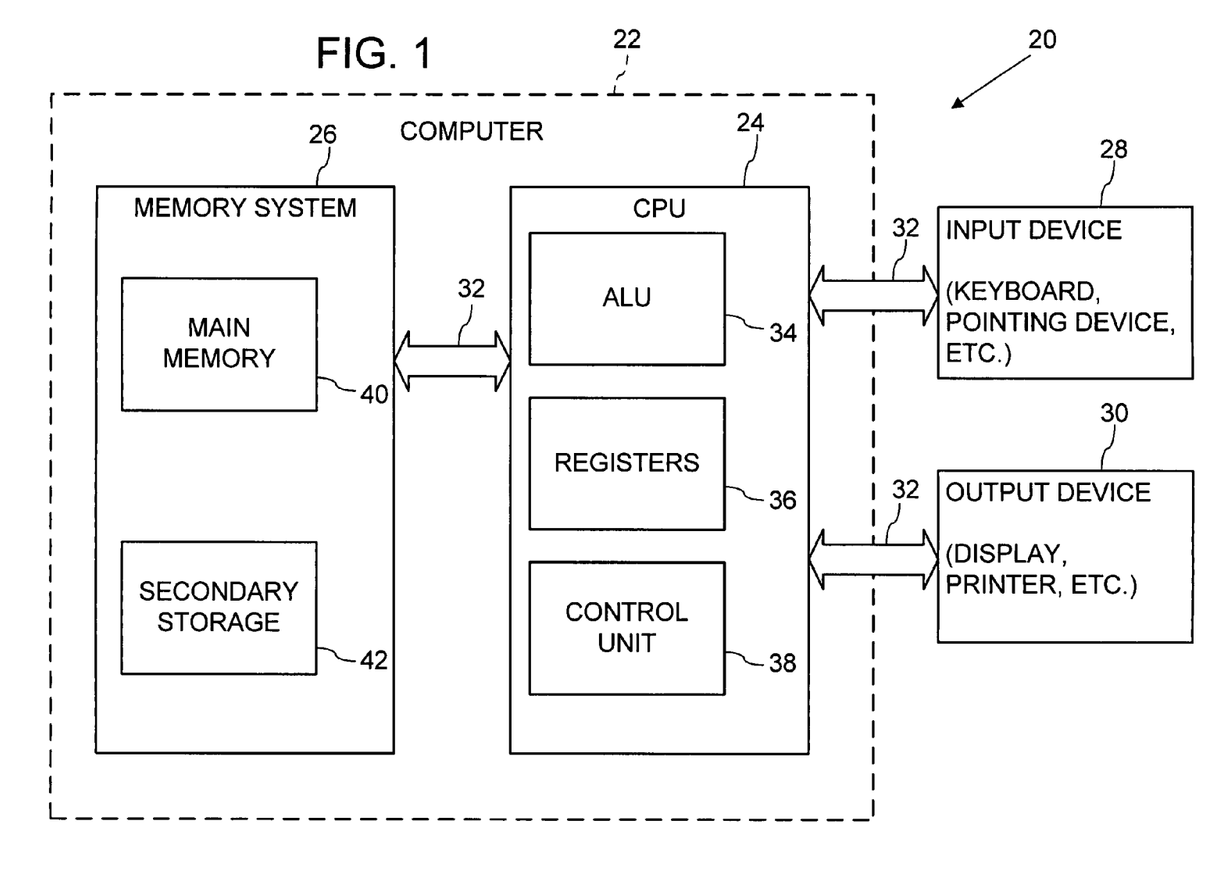
FIG. 1 is a block diagram of a computer system that may be used to implement the present invention.

FIG. 1 illustrates an operating environment for an embodiment of the present invention as a computer system 20 with a computer 22 that comprises at least one high speed processing unit (CPU) 24 in conjunction with a memory system 26, an input device 28, and an output device 30. These elements are interconnected by at least one bus structure 32.

The illustrated CPU 24 is of familiar design and includes an ALU 34 for performing computations, a collection of registers 36 for temporary storage of data and instructions, and a control unit 38 for controlling operation of the system 20. The CPU 24 may be a processor having any of a variety of architectures including Alpha from Digital, MIPS from MIPS Technology, NEC, IDT, Siemens, and others, x86 from Intel and others, including Cyrix, AMD, and Nexgen, and the PowerPC from IBM and Motorola.

The memory system 26 generally includes high-speed main memory 40 in the form of a medium such as random access memory (RAM) and read only memory (ROM) semiconductor devices, and secondary storage 42 in the form of long term storage mediums such as floppy disks, hard disks, tape, CD-ROM, flash memory, etc. and other devices that store data using electrical, magnetic, optical or other recording media. The main memory 40 also can include video display memory for displaying images through a display device. Those skilled in the art will recognize that the memory 26 can comprise a variety of alternative components having a variety of storage capacities.

The input and output devices 28 and 30 also are familiar. The input device 28 can comprise a keyboard, a mouse, a physical transducer (e.g., a microphone), etc. The output device 30 can comprise a display, a printer, a transducer (e.g., a speaker), etc. Some devices, such as a network interface or a modem, can be used as input and/or output devices.

As is familiar to those skilled in the art, the computer system 20 further includes an operating system and at least one application program. The operating system is the set of software which controls the computer system's operation and the allocation of resources. The application program is the set of software that performs a task desired by the user, using computer resources made available through the operating system. Both are resident in the illustrated memory system 26.

In accordance with the practices of persons skilled in the art of computer programming, the present invention is described below with reference to acts and symbolic representations of operations that are performed by computer system 20, unless indicated otherwise. Such acts and operations are sometimes referred to as being computer-executed and may be associated with the operating system or the application program as appropriate. It will be appreciated that the acts and symbolically represented operations include the manipulation by the CPU 24 of electrical signals representing data bits which causes a resulting transformation or reduction of the electrical signal representation, and the maintenance of data bits at memory locations in memory system 26 to thereby reconfigure or otherwise alter the computer system's operation, as well as other processing of signals. The memory locations where data bits are maintained are physical locations that have particular electrical, magnetic, or optical properties corresponding to the data bits.

Figure 2:
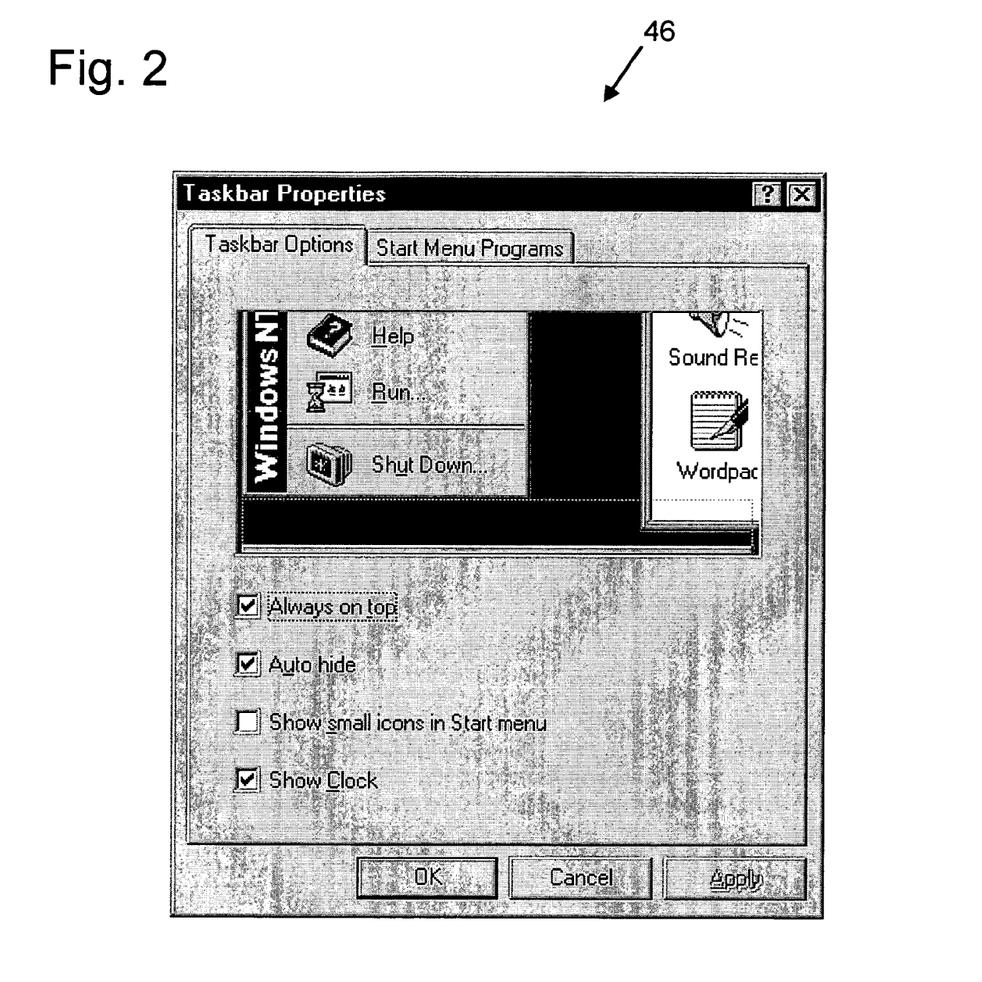
FIG. 2 is an illustration of a first exemplary palettized image.
Figure 3:
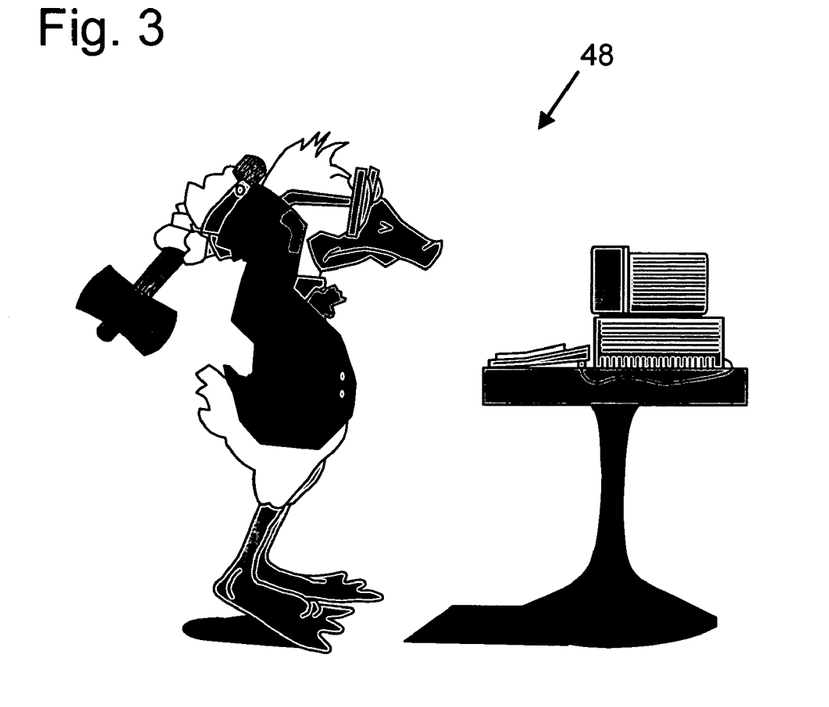
FIG. 3 is an illustration of a second exemplary palettized image.

FIGS. 2 and 3 are simplified diagrams illustrating palettized images 46 and 48, which are sometimes called discrete-tone images. One way to characterize a palettized image is that the number of colors in the image is small compared to the number of pixels in the image (i.e., the image size). Another way to characterize a palettized image is that the number of colors in the image is represented by N-number or fewer binary bits, with N having a value of about 8. Generally, a palettized image is contrasted with a continuous tone image, such as a photograph, that potentially includes large numbers of colors or tones in comparison to the number of pixels in the image. As an example, palettized images are commonly used in various computer user interfaces, including those for desktop software applications, Internet (e.g., World Wide Web) network sites, etc. It will be appreciated, however, that palettized images can arise in various other computer applications.

Figure 4:
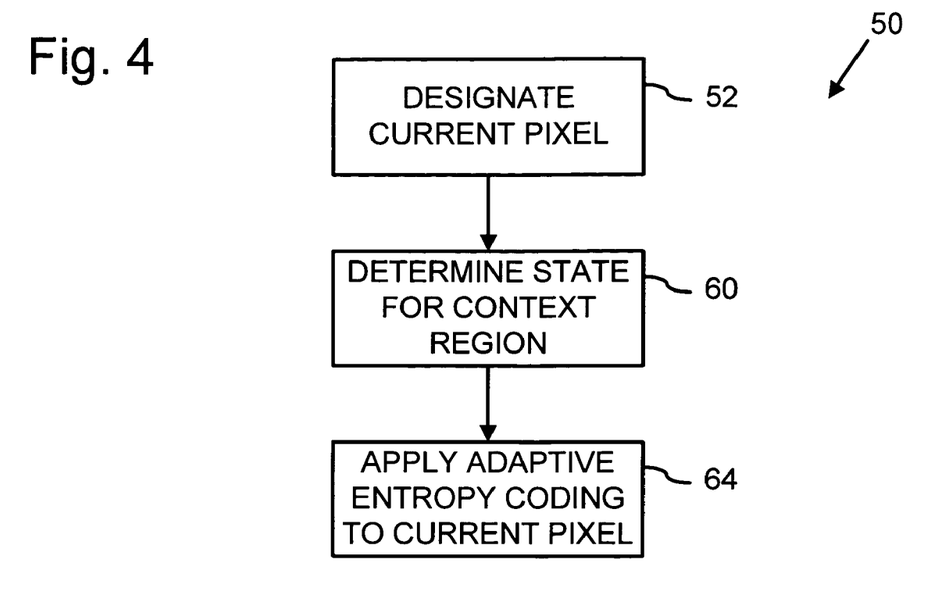
FIG. 4 is a flow diagram of a palettized image compression method for compressing or encoding data representing palettized images.

FIG. 4 is a flow diagram of a palettized image compression method 50 for compressing or encoding image data representing palettized images. Palettized image compression method 50 compresses palettized images with high efficiency and no loss of information, and so may be referred to as a lossless compression method. Palettized image compression method 50 compresses palettized images on a pixel-by-pixel basis.

Figure 5:
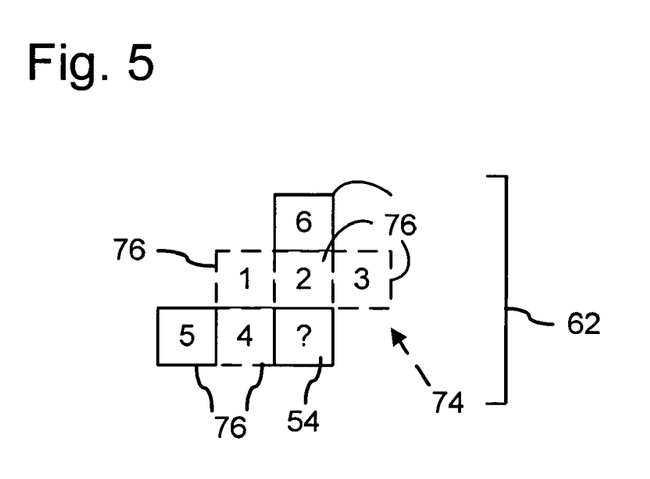
FIG. 5 is diagram illustrating a causal context region that is in the vicinity of a current pixel being encoded.
Figure 6:
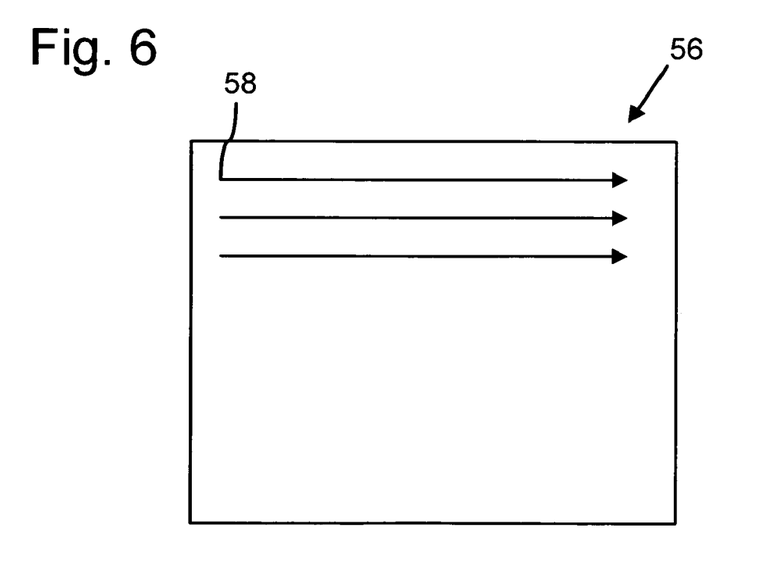
FIG. 6 is a diagram of a predefined encoding pattern or sequence for encoding a palettized image.

Process block 52 indicates that a "current" pixel 54 (FIG. 5) is designated for encoding. Successive adjacent pixels of a palettized image are encoded in a predefined encoding pattern or sequence 56 (FIG. 6). In the illustrated implementation, the pixels of a palettized image are encoded left-to-right across successive horizontal rows of pixels, beginning with a start pixel 58 at the upper left corner of the image. It will be appreciated that other encoding patterns or sequences could alternatively be applied.

Process block 60 indicates that a state is determined for a causal context region 62 (FIG. 5), sometimes referred to as extended causal context region 62, that includes a predefined set of previously encoded pixels that are in the vicinity of current pixel 54, as described below in greater detail. In accordance with the present invention, quantization of causal context region 62 into patterns greatly reduces the number of possible states in comparison to prior encoding processes, thereby supporting the high efficiency of palettized image compression method 50.

Process block 64 indicates that current pixel 54 is adaptively entropy coded with regard to the predefined set of previously encoded pixels within causal context region 62. In one implementation, the adaptive entropy coding includes arithmetic coding, which is known in the art and described in *Introduction to Data Compression* by Khalid Sayood, Morgan Kaufmann Publishers, Inc., San Francisco, Calif., 1996. Other suitable adaptive entropy coding methods include adaptive Huffman codes.

Figure 7:
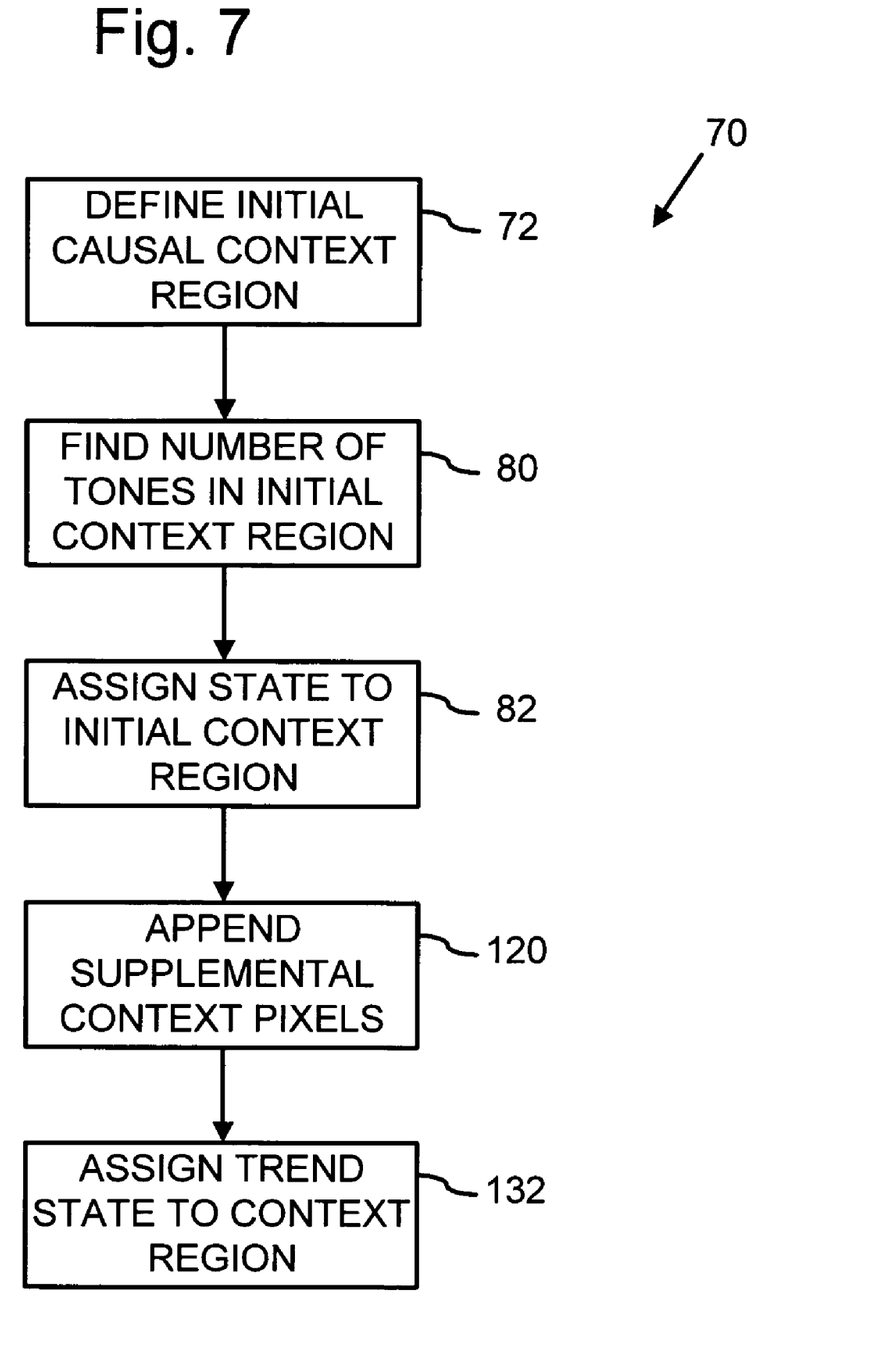
FIG. 7 is a flow diagram of a method of determining a state for causal context region in the vicinity of a current pixel.

FIG. 7 is a flow diagram of a state determination method 70 for determining a state for causal context region 62 in the vicinity of current pixel 54.

Process block 72 indicates that a basic causal context region 74 (FIG. 5) is defined with regard to current pixel 54 to be encoded. Basic causal context region 74 corresponds to context pixels 76-1, 76-2, 76-3, and 76-4 in the palettized image that have been previously encoded and are immediately adjacent (i.e., contact) current pixel 54. The illustrated implementation corresponds to an image in which pixels are arranged in a conventional rectangular array, which results in basic context region 74 having only four context pixels 76 that are immediately adjacent current pixel 54. Also, the arrangement of context pixels 76 relates to the illustrated left-to-right, top-to-bottom encoding pattern 56. It will be appreciated that a different pixel arrangement and a different encoding pattern could result in a different basic context region.

Each pixel has associated with it a value, called an image value, which corresponds to the color or tone, or other image characteristics of the pixel. Process block 80 indicates that the image values of context pixels 76 are compared to determine the pattern of unique image values among the four context pixels, thereby to classify basic context region 74 by the pattern of unique image values or tones among the four pixels. For example, basic context region 74 is referred to as one-tone context if all four context pixels have the same image value. If there are two unique values, basic context region 74 is called a two-tone context, and so on. With only four context pixels 76, the image values within basic context region 74 can correspond to one-, two-, three-, or four-tone contexts.

Figure 8:
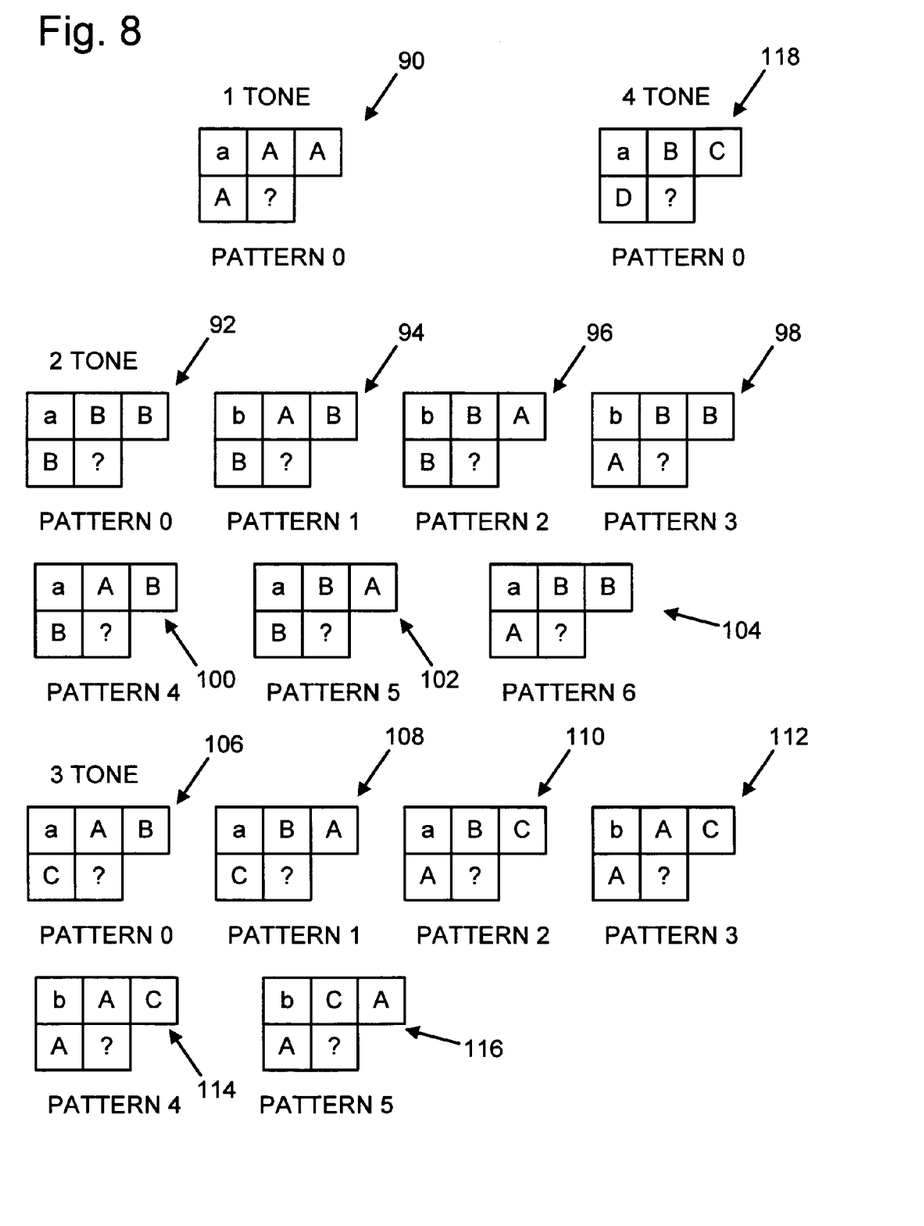
FIG. 8 illustrates a universe of image tone pattern classifications for a basic context region according to the present invention.

Process block 82 indicates that a tone pattern of basic context region 74 is assigned a state according to the arrangement of unique image values or tones among the four context pixels 76. FIG. 8 illustrates the universe of fifteen tone patterns classifications for basic context region 74.

In particular, a one-tone pattern has only one possible classification 90 that is designated as "tone 1, pattern 0" corresponding to all context pixels 76 having the same image value or tone (e.g., designated "a"). A two-tone pattern may be any of seven classifications 92–104 that are designated as patterns 0–6, respectively. A three-tone pattern may be any of six classifications 106–116 as patterns 0–5, respectively. A four-tone pattern has only one possible classification 118 that is designated as "tone 4, pattern 0."

This classification of basic context region 74 by the number tones and their arrangement is based upon context pixels 76 having equal image values, or not. Other than this equality or inequality of the image values or tones, the classification of basic context region 74 is independent of the actual image values. The pattern classification is only concerned with spatial distribution of the pattern, and not the values themselves. In contrast, conventional encoding methods base regional contexts on the actual image values, not the pattern of unique values. Even with a relatively simple color spectrum of 256 colors (i.e., 8-bit colors), a conventional regional context of four pixels would encompass many millions of possible patterns, rather than the 15 patterns shown in FIG. 8. As a result, classification of basic context region 74 according to the arrangements of unique image values or tones, rather than actual tones, provides a greatly reduced set of possible context patterns, thereby providing a significant increase in encoding efficiency.

Process block 120 indicates that supplemental context pixels 76-5 and 76-6 (FIG. 5) are appended to basic causal context region 74 to complete the extended context region 62 and to detect any non-local trend extending through region 62. Supplemental context pixels 76-5 and 76-6 are horizontally- and vertically-aligned with current pixel 54 and detect horizontal and vertical trends, respectively. As shown in FIG. 2, for example, many palettized images may include image features with horizontal or vertical boundaries that would correspond to non-local trends through overall context region 62. A horizontal trend is indicated when context pixel 76-4 has an image value or tone equaling that of context pixel 76-5. A vertical trend is indicated when context pixel 76-3 has an image value or tone equaling that of context pixel 76-6.

Figure 9:
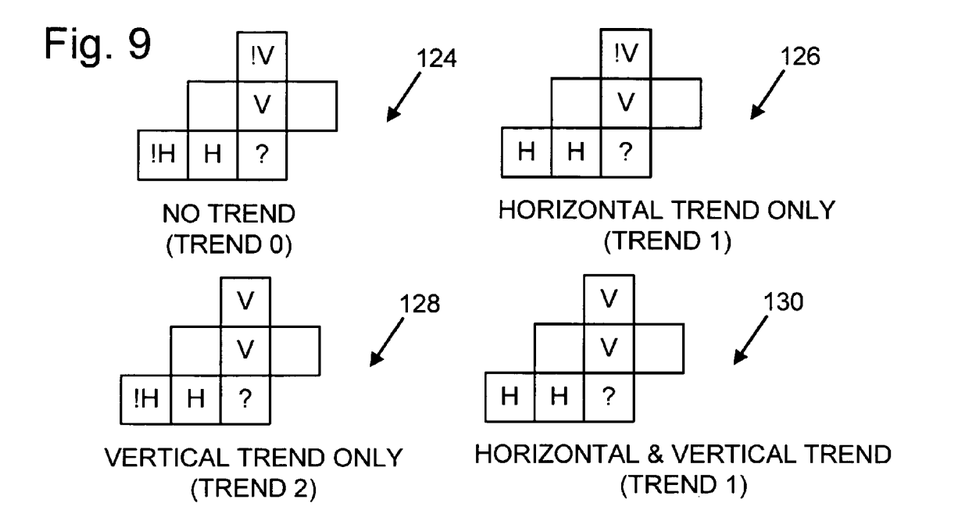
FIG. 9 illustrates four possible trend tone patterns of a pair of supplemental context pixels.

FIG. 9 illustrates the four possible trend tone patterns 124–130 of supplemental context pixels 76-5 and 76-6. In trend tone pattern 124, neither of supplemental context pixels 76-5 and 76-6 has the same tone as either of respective context pixels 76-4 and 76-2, thereby corresponding to no trends. In trend tone pattern 126, supplemental context pixel 76-5 has the same tone context pixel 76-4, but pixels 76-6 and 76-2 differ from each other, thereby corresponding only to a horizontal trend. In trend tone pattern 128, supplemental context pixel 76-6 has the same tone context pixel 76-2, but pixels 76-5 and 76-4 differ from each other, thereby corresponding only to a vertical trend. In trend tone pattern 130, both of supplemental context pixels 76-5 and 76-6 have the same tones as respective context pixels 764 and 76-2, thereby corresponding to both horizontal and vertical trends.

The presence or absence of horizontal or vertical trends classifies each pattern into another four trend states 124–130. In combination the fifteen possible states or patterns of basic context region 74, the six context pixels 76-1 through 76-6 can represent a total of sixty states into which the overall context region can be classified.

Process block 132 indicates that a trend state is assigned to context region 62.

Figure 10:
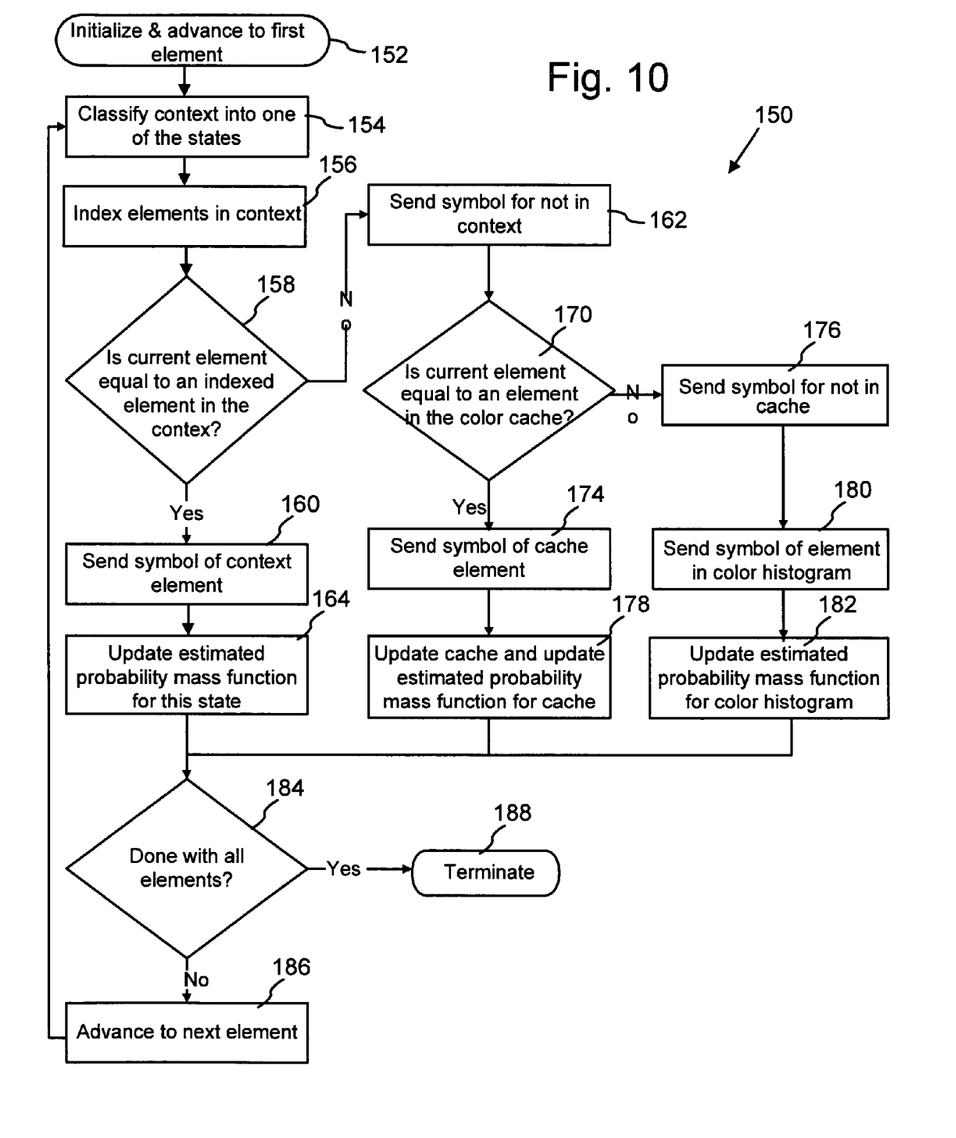
FIG. 10 is a flow diagram of an entropy coding method employed in one implementation of the present invention.

FIG. 10 is a flow diagram of an entropy coding method 150 employed in one implementation of the present invention.

Process block 152 indicates that method 150 is initialized that a first current pixel 54 is designated.

Process block 154 indicates that a context region 62 is classified into a selected state by, for example, state determination method 70.

Process block 156 indicates that each of the unique values of the pixels or elements in the context region 62 is indexed, as known in the art of entropy coding.

Inquiry block 158 represents an inquiry as to whether current element 54 has a value equal to that of a previously indexed pixel or element of the selected state. Inquiry block 158 proceeds to process block 160 whenever current element 54 has a value equal to that of a previously indexed pixel or element of the selected state. Inquiry block 158 proceeds to process block 162 whenever current element 54 has a value that is not equal to that of a previously indexed pixel or element of the selected state.

Process block 160 indicates that an entropy code symbol corresponding to the value of the previously indexed element is written, stored, or otherwise sent.

Process block 164 indicates that an estimated probability mass function for each of the indices in the selected state is updated to reflect the symbol written in process block 160. As is known in the art of entropy coding, a probability mass function is maintained for each symbol being encoded. This allows the entropy coding to be adaptively trained to the statistics of each source, and sends shorter symbols for the tone indices that are popular for each state. This adaptation allows the coder to improve its efficiency by using knowledge of previous patterns in the image to code future similar patterns. Some examples include line or checkerboard patterns that are quick to learn. Other more complicated phenomena may include a particular font for text.

Process block 162 indicates that an entropy code symbol is sent or designated indicating a not-in-context element.

Figure 11:
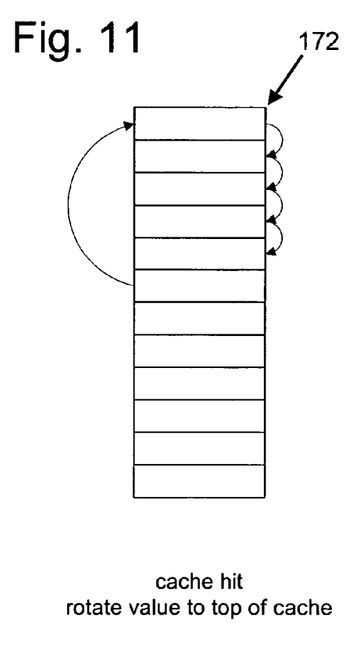
FIGS. 11 and 12 are diagrams illustrating operation of a color cache employed in the arithmetic coding method of FIG. 10.
Figure 12:
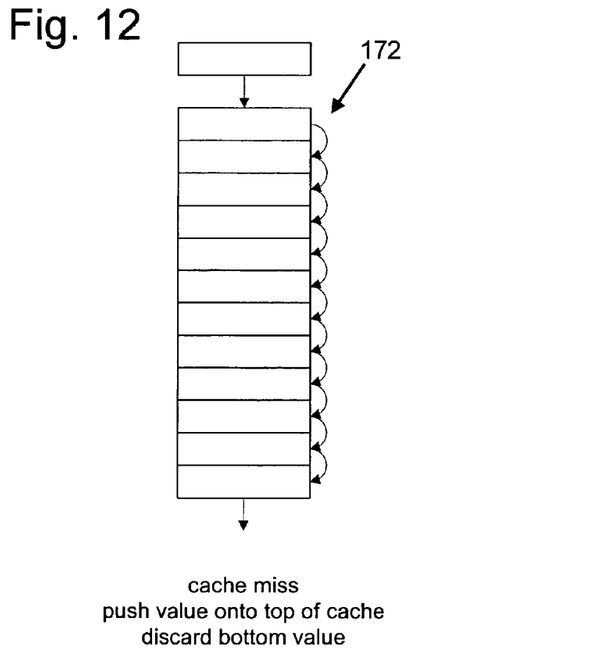

Inquiry block 170 represents an inquiry as to whether current element 54 has a value equal to one maintained in a color cache 172 (FIGS. 11 and 12). Color cache 172 maintains an ordered list of the most recently used values that were out of context. The ordered list of color cache 172 is different from a conventional list of the most commonly used values, which does not work as well due to poor local adaptation. Inquiry block 170 proceeds to process block 174 whenever current element 54 has a value equal to one maintained in color cache 172. Inquiry block 170 proceeds to process block 176 whenever current element 54 does not have a value equal to one maintained in color cache 172.

Process block 174 indicates that the index for the cache entry is determined, and the symbol for the index is written or stored. The index is determined by sequentially searching the cache from most recently used values to least recently used values, ignoring any values that may have already appeared in the tones for the context.

It will be appreciated that the logical state of cache 172 is a subset of elements in the physical cache. Since the value being coded was out of context, it by definition cannot have the same value as any of the tones in the context. Therefore, any elements in cache 172 that have the same value as any of the tones are not useful, and are removed from the logical state of cache 172. The remaining values are indexed and the probability mass function for the indices are estimated and adapted every time a value is coded out of context.

Process block 178 indicates that color cache 172 and its estimated probability mass function are updated to reflect the symbol written in process block 172. As illustrated in FIG. 11, this updating of color cache 172 includes rotating to the top the value of the symbol being written.

Process block 176 indicates that an entropy code symbol is sent or designated indicating a not-in-cache element.

Process block 180 indicates that the index for a color histogram entry is determined, and the symbol for the index is written or stored. The color histogram contains all the possible values for an element and keeps track of the probabilities of all the out of cache values. This distribution is used to write the symbol for the out of cache value.

Process block 182 indicates that the color histogram and its estimated probability mass function are updated to reflect the symbol written in process block 180. In addition, the symbol value is placed (pushed) at the top of color cache 172, and the least recently used value drops (pops) out of the bottom of cache 172 as in a queue (FIG. 12).

Inquiry block 184 represents an inquiry as to whether there is another element or pixel to be coded. Inquiry block 184 proceeds to process block 186 whenever there is another element or pixel to be coded. Inquiry block 184 proceeds to termination block 188 whenever there is not another element or pixel to be coded.

Process block 186 indicates that the method advances to the next pixel or element. Process block 186 returns to process block 154.

Having described and illustrated the principles of our invention with reference to an illustrated embodiment, it will be recognized that the illustrated embodiment can be modified in arrangement and detail without departing from such principles. It should be understood that the programs, processes, or methods described herein are not related or limited to any particular type of computer apparatus, unless indicated otherwise. Various types of general purpose or specialized computer apparatus may be used with or perform operations in accordance with the teachings described herein. Elements of the illustrated embodiment shown in software may be implemented in hardware and vice versa.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

The invention claimed is:

1. An image encoding method for compressing image data representing plural pixels of plural nonzero image tones, comprising:
   designating a current pixel to be encoded;
   identifying within a basic context region that includes multiple context pixels that are adjacent the current pixel, each of the context pixels having an image tone, the pattern of unique image tones among the context pixels in the context region;
   identifying within an extended context region that includes the basic context region a non-local trend within the context pixels;
   assigning a state according to identifications made within the basic and extended context regions; and
   adaptive entropy coding the current pixel with reference to the state of the context region.

2. The method of claim 1 in which identifying a non-local trend includes identifying non-local trends that are in horizontal or vertical alignment with the current pixel.

3. The method of claim 1 in which the adaptive entropy coding includes arithmetic coding.

4. The method of claim 1 in which the pattern of unique image tones is identified with reference only to context pixels that are immediately adjacent the current pixel.

5. The method of claim 1 in which the pattern of tones is identified with reference to only four context pixels.

6. The method of claim 1 in which the adaptive entropy coding includes arithmetic coding in which the current pixel may be encoded according to a previously encoded pixel having the same tone or as a not-in-context element corresponding to a tone in a color cache representing an ordered list of most recent not-in-context values.

7. In a computer readable medium, image encoding software for compressing image data representing plural pixels of plural nonzero image tones, comprising:
   software for designating a current pixel to be encoded;
   software for identifying within a basic context region that includes multiple context pixels that are adjacent the current pixel, each of the context pixels having an image tone, a pattern of unique image tones among the context pixels in the context region;
   software for identifying within an extended context region that includes the basic context region a non-local trend within the context pixels;
   software for assigning a state according to identifications made within the basic and extended context regions; and
   software for adaptive entropy coding the current pixel with reference to the state of the context region.

8. The medium of claim 7 in which the software for identifying a non-local trend includes software for identifying non-local trends that are in horizontal or vertical alignment with the current pixel.

9. The medium of claim 7 in which the software for adaptive entropy coding includes software for arithmetic coding.

10. The medium of claim 7 in which the pattern of unique image tones is identified with reference only to context pixels that are immediately adjacent the current pixel.

11. The medium of claim 7 in which the pattern of tones is identified with reference to only four context pixels.

12. The medium of claim 7 in which the software for adaptive entropy coding includes software for arithmetic coding in which the current pixel may be encoded according to a previously encoded pixel having the same tone or as a not-in-context element corresponding to a tone in a color cache representing an ordered list of most recent not-in-context values.

* * * * *